United States Patent [19]

Spellman et al.

[11] 4,398,205
[45] Aug. 9, 1983

[54] GATE TURN-OFF DEVICE WITH HIGH TURN-OFF GAIN

[75] Inventors: Gordon B. Spellman, Mequon; Herman P. Schutten, Elm Grove; Stanley V. Jaskolski, Sussex, all of Wis.

[73] Assignee: Eaton Corporation, Cleveland, Ohio

[21] Appl. No.: 184,688

[22] Filed: Sep. 8, 1980

Related U.S. Application Data

[63] Continuation of Ser. No. 972,443, Dec. 22, 1978, abandoned.

[51] Int. Cl.³ .............................................. H01L 29/74
[52] U.S. Cl. .................................... 357/38; 357/35; 357/44; 307/252 A; 307/252 C; 307/252 G; 307/305
[58] Field of Search .................... 357/35, 38, 44; 307/252 A, 252 C, 252 G, 305

[56] References Cited

U.S. PATENT DOCUMENTS

| | | |
|---|---|---|
| 3,524,113 | 8/1970 | Agusta et al. ........................ 357/35 |
| 3,979,766 | 9/1976 | Tsuyuki ................................ 357/38 |
| 4,015,143 | 3/1977 | Tokunaga et al. ..................... 357/38 |
| 4,112,315 | 9/1978 | Ohhinata .......................... 307/252 A |

*Primary Examiner*—Joseph E. Clawson, Jr.
*Attorney, Agent, or Firm*—C. H. Grace; M. E. Taken

[57] ABSTRACT

A gate turn-off device is disclosed having a load current carrying power transistor regeneratively collector-base coupled with another transistor, and includes a third, shunting transistor providing high gain turn-off. The device is turned ON by signal current of one polarity applied to the base of the power transistor driving the latter into conduction to carry load current, and the device remains ON upon removal of the signal due to base drive supplied by the collector of the other transistor in the regenerative loop. A third transistor is connected to one of the collector-base junctions to shuntingly break the regenerative loop when the third transistor is biased into conduction, thus providing higher gain turn-off. A single ON-OFF control terminal is disclosed, as well as separate ON and OFF control terminals.

3 Claims, 4 Drawing Figures

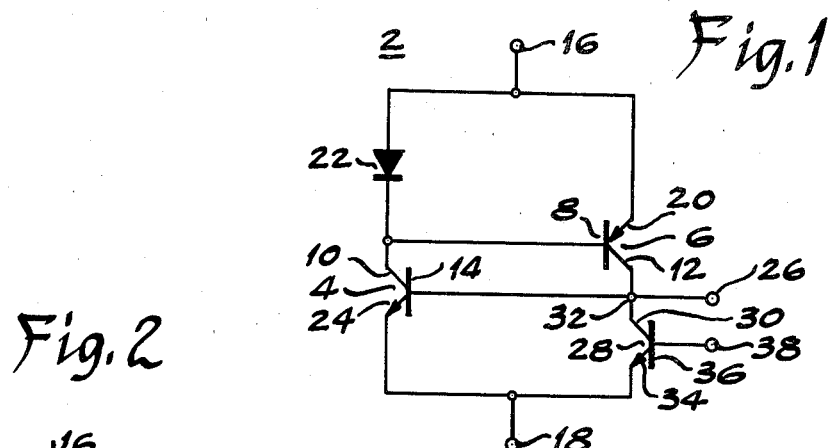
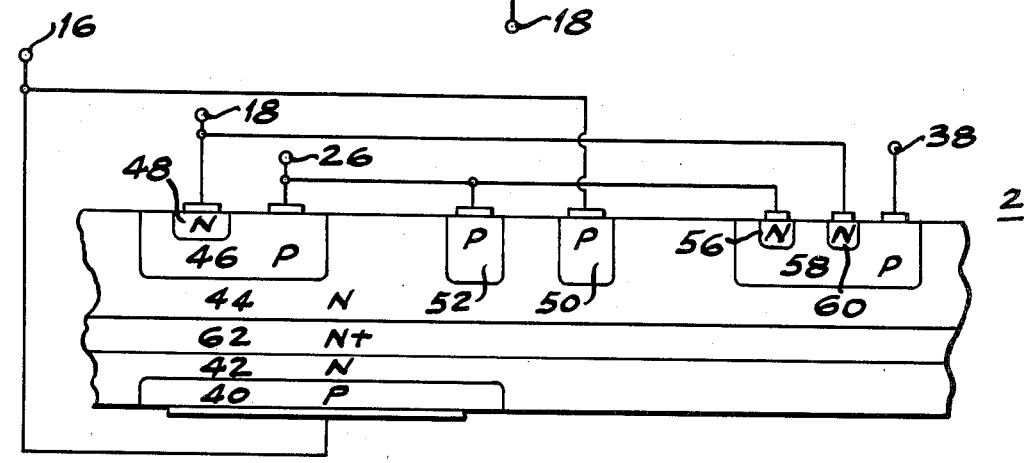
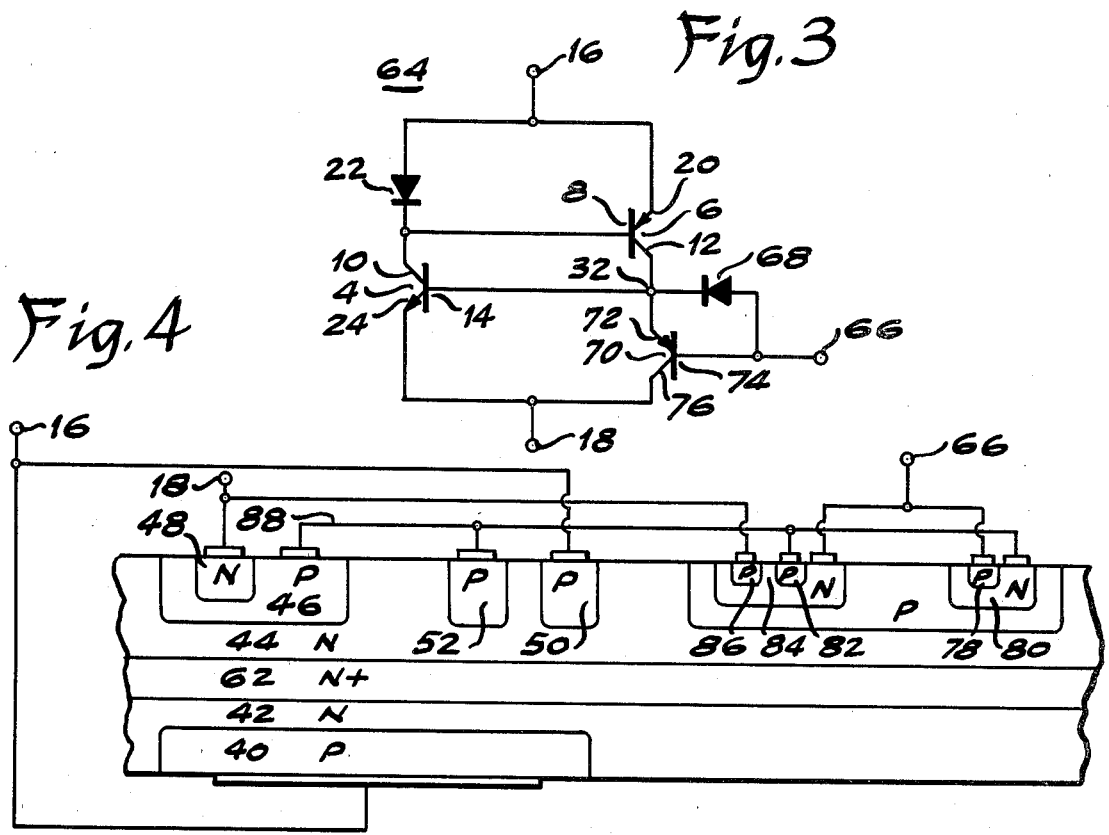

GATE TURN-OFF DEVICE WITH HIGH TURN-OFF GAIN

This is a Continuation of application Ser. No. 972,443, filed Dec. 22, 1978, now abandoned.

BACKGROUND OF THE INVENTION

Gate turn-off devices are known in the art. Generally, a thyristor can be turned on with a small gating signal of one polarity, say positive. Since a thyristor is a regenerative element, it will stay conductive above a certain minimum holding current flowing between its main terminals, even if gate drive is removed. Such thyristor can typically be turned off by a negative gating signal. For low level conduction current through the thyristor, say only slightly above the minimum holding current, only a small negative gating signal is necessary to turn it off. However, when the thyristor is conducting heavily with a high amount of current flow therethrough, turn-off is difficult or impossible and requires a substantially larger negative gating signal.

Numerous schemes are known for accomplishing turn-off. One approach is to supply the requisite high level off signal by means of a short duration, high level pulse, for example by capacitor discharge.

Another approach is to attack the problem from a different angle and attempt to reduce the requisite magnitude of the off signal necessary to achieve turn-off. For example, rather than using a thyristor alone as the power switching element, it is instead used as a low level regeneration element to control a non-regenerative power element (i.e. continual gating or driving current is necessary to maintain conduction.) The thyristor is connected to drive the power element into conduction such that the latter carries load current and the thyristor carries only a small on current which is above its minimum holding value and which is also above the minimum driving current necessary to maintain continued conduction of the power element. It is thus generally known to employ the combination of a low level regeneration element controlling a high current capacity non-regenerative element in order to achieve high turn-off gain by breaking the regenerative loop with a low level signal.

Another approach is to effectively split the thyristor into its two composite transistors and have one of them be a power transistor carrying most of the load current, but retain the regenerative coupling between the transistors. The regenerative loop current between the composite transistors drives the base of the power transistor and is kept at a low level to facilitate turn-off.

SUMMARY OF THE INVENTION

The present invention relates to improvements in the last mentioned approach.

An object of the invention is to provide a gate turn-off device of the aforementioned character having higher turn-off gain to enable a small signal current to turn off a substantially larger load current.

Another object of the invention is to provide a gate turn-off device of the aforementioned character adaptable for single gate ON-OFF control or for dual gate ON-OFF control.

Another object of the invention is to provide a gate turn-off device of the aforementioned character which may be constructed in discrete form or whose elements may be monolithically integrated in a common substrate.

Other objects and advantages will hereinafter appear.

BRIEF DESCRIPTION OF THE DRAWINGS

FIG. 1 is a circuit diagram of gate turn-off device constructed in accordance with the invention.

FIG. 2 is a substrate drawing of the device of FIG. 1.

FIG. 3 is a circuit diagram of another gate turn-off device constructed in accordance with the invention.

FIG. 4 is a substrate drawing of the device of FIG. 3.

DESCRIPTION OF THE PREFERRED EMBODIMENT

There is shown in FIG. 1 a gate turn-off device, generally designated by the reference character 2. A pair of regeneratively coupled transistors 4 and 6 re provided by connecting base 8 to collector 10, and collector 12 to base 14 as shown. The device has a pair of main terminals 16 and 18 for carrying load current. Main anode terminal 16 is connected to emitter 20 of PNP transistor 6, and is also connected through diode 22 to collector 10 of NPN transistor 4. Main cathode terminal 18 is connected to emitter 24 of transistor 4.

Device 2 is turned ON by applying a positive gating signal current to control terminal 26 which is connected to base 14 of transistor 4 whereby the latter is driven into conduction. Conduction of transistor 4 draws current out of base 8 of transistor 6 rendering the latter conductive which in turn now supplies base drive to transistor 4 thus completing the regenerative coupling, and hence device 2 will stay ON after removal of signal current from control terminal 26. Load current flows through diode 22 and transistor 4 between main terminals 16 and 18.

Device 2 is turned OFF by applying a negative signal at control terminal 26. This breaks the regenerative loop, thus terminating base drive to transistor 4 whereby the latter is rendered non-conductive and no load current flows between terminals 16 and 18.

Turn-off gain is the ratio of the magnitude of load current through device 2 to the magnitude of the off signal necessary to turn device 2 OFF. The lower the regenerative loop current, the lower the magnitude of signal current at control terminal 26 necessary to break such loop and turn device 2 OFF, and hence the higher the turn-off gain. As will be more fully explained hereinafter, most of the current from anode terminal 16 can be diverted through diode 22 and power transistor 4, rather than to transistor 6, and hence only a small amount of current flows through the regenerative loop. Such current diversion can be accomplished as desired by a number of means, including: a series resistance between terminal 16 and emitter 20; in integrated versions, PN junction area design; etc. Even with appropriate current diversion, there is still a limit on turn-off gain because the regenerative loop current cannot be reduced below the minimum holding value for such loop if it is desired that device 2 stay ON after removal of the positive gating signal.

The present invention increases turn-off gain by employing in the embodiment of FIG. 1 a third transistor 28 having a collector 30 connected to collector-base junction 32 of the regenerative loop, and an emitter 34 connected to main cathode terminal 18. NPN transistor 28 has a base 36 connected to a second control terminal 38. A positive signal current at terminal 38 biases transistor 28 into conduction whereby current from collector 12 now flows through transistor 28, rather than to base 14, and hence the regenerative loop is broken and device 2 is turned OFF. The magnitude of the signal at control terminal 38 necessary for turn-off is smaller than the magnitude of turn-off signal necessary at control terminal 26, for example ten times smaller if the gain of transistor 28 is ten. A higher turn-off gain is thus provided wherein a small signal current can turn off a substantially larger load curre Device 2 may be constructed in discrete or in integrated form. A preferred embodiment of the latter is shown in FIG. 2.

Referring to FIG. 2, P region 40 and N region 42 form diode 22. N region 44, P region 46 and N region 48 form collector, base and emitter, respectively of NPN power transistor 4. P region 50, N region 44 and P region 52 form emitter, base and collector, respectively, of PNP transistor 6 for regenerative loop coupling purposes with power transistor 4. N region 56, P region 58 and N region 60 form collector, base and emitter, respectively, of NPN transistor 28. N+ substrate region 62 prevents vertical SCR regenerative action between diode 22 and transistor 4 due to the low minority carrier lifetime in the N+ region, and also enables low saturation resistance for transistor 4. When appropriate current diversion can be afforded by a series resistor interposed between anode terminal 16 and P region 50, and/or by PN junction area design, for example a laterally extended dimension of P region 50, etc.

All three transistors 4, 6 and 28 are thus built monolithically in a single substrate, power transistor 4 being vertical for high current capacity, and transistors 6 and 28 being lateral for easy access and control terminal connection purposes. The three transistors have negligible parasitic interaction; distance or moats can be used to accomplish this isolation. Main anode terminal 16 is ohmically connected to P region 40 and P region 50. Main cathode terminal 18 is ohmically connected to N region 48 and N region 60. First control terminal 26 is ohmically connected to P region 46, P region 52 and N region 56. Second control terminal 38 is ohmically connected to P region 58.

FIG. 3 is a circuit diagram of a gate turn-off device 62 which is similar to device 2 of FIG. 1, and the same reference characters are used for efficiency and ease of understanding. Device 64 has only a single control terminal 66 connected through added diode 68 to base 14. NPN transistor 28 of FIG. 1 is replaced by opposite polarity PNP transistor 70 having emitter 72 connected to junction 32, base 74 connected to control terminal 66, and collector 76 connected to main cathode terminal 18. A positive signal at control terminal 66 flows through aiding diode 68 to base 14 initiating regenerative loop current and turning device 64 ON similarly to device 2. A negative signal on control terminal 66 renders transistor 70 conductive, thus turning device 64 OFF similarly to device 2. A single control terminal thus controls the ON-OFF operation of device 64, and high turn-off gain is afforded by third transistor 70.

A preferred form of an integrated embodiment of device 64 is shown in FIG. 4, wherein the same reference characters as in FIG. 2 are used for ease of understanding. P region 78 and N region 80 form diode 68. P region 82, N region 84 and P region 86 form emitter, base and collector, respectively, of PNP transistor 70. Main cathode terminal 18 is ohmically connected to N region 48 and P region 86. Control terminal 66 is ohmically connected to P region 78 and N region 84. There is an ohmic connection 88 between P region 46, P region 52, P region 82 and N region 80. The remainder of the teachings of device 2 are applicable to device 64.

What is claimed is:

1. A monolithically integrated turn-off semiconductor switch device comprising:

a pair of main terminals for carrying load current;

a control terminal which enables said device to be turned ON by a signal current of one polarity and turned OFF by a signal current of opposite polarity;

first non-regenerative switch means comprising a power transistor formed vertically in a substrate by first, second, and third regions of alternating conductivity types;

a diode formed by fourth and fifth regions of opposite conductivity types in series with the aforementioned regions of said vertical transistor but separated therefrom by a sixth region of said substrate doped to provide low minority carrier lifetimes therein and prevent vertical regenerative action between said diode and said vertical transistor;

said fourth region of said diode being disposed on a bottom surface of said substrate and ohmically connected to one of said main terminals and;

said third region of said vertical transistor being disposed on the top surface of said substrate and ohmically connected to the other of said main terminals;

second non-regenerative switching means comprising a transistor of opposite conductivity type to said vertical transistor laterally formed in said substrate by said first region of said vertical transistor, and by a seventh and an eighth regions of alternating conductivity types, said seventh region being disposed on the top surface of said substrate and ohmically connected to said one of said main terminals, and said eighth region also being disposed on the top surfaces of said substrate;

said first and second individually non-regenerative switching means being parasitically isolated from each other on said substrate, but regeneratively coupled to supply each other's base drive current and form a regenerative current loop therebetween, and said control terminal being connected to said regenerative coupling such that application of signal current of said one polarity initiates regenerative loop current between said first and second individually non-regenerative switching means; and third non-regenerative switching means comprising a third transistor monolithically integrated laterally in said substrate and parasitically isolated from said vertical and lateral transistors and said diode and comprising ninth, tenth and eleventh regions of alternating conductivity types, said third switching means having ohmic connections to said regenerative loop and said other of said main terminals such that upon application of base drive signal current thereto being rendered conducting to shunt current from said regenerative loop to thereby render said first switching means non-conductive to turn off said device.

2. A monolithically integrated gate turn off semiconductor switching device according to claim 1 wherein said second region of said vertical transistor and said ninth region of said last specified lateral transistor are ohmically connected to said control electrode, and wherein a second control electrode is provided and ohmically connected to said tenth region of said last specified lateral transistor, said second control electrode upon application of a signal current of said one polarity rendering said last specified transistor conducting to effect interruption of current flow in the regenerative loop between said vertical and the first mentioned lateral transistor.

3. A monolithically integrated gate turn off semiconductor switching device according to claim 1 together with a second diode formed in the top surface of said substrate and parasitically isolated from said transistors and the first mentioned diode on said substrate, said second diode having ohmic connection with said control electrode, said regenerative loop, and to said last specified lateral transistor, said control terminal when subjected to a control signal of a polarity opposite said one polarity rendering said last specified transistor conducting to effect interruption of current flow in the regenerative loop between said vertical and first mentioned lateral transistor.

* * * * *